United States Patent [19]

Logue

[11] Patent Number: 5,554,933
[45] Date of Patent: Sep. 10, 1996

[54] POLAR COORDINATES SENSOR PROBE FOR TESTING MATERIAL SURROUNDING FASTENER HOLES

[76] Inventor: Delmar L. Logue, R.R. #1, Box 60, Herrick, Ill. 62431

[21] Appl. No.: 217,738

[22] Filed: Mar. 25, 1994

Related U.S. Application Data

[63] Continuation-in-part of Ser. No. 842,244, Feb. 27, 1992, Pat. No. 5,404,101, Ser. No. 108,880, Aug. 13, 1993, abandoned, Ser. No. 170,058, Dec. 20, 1993, Ser. No. 187,072, Jan. 27, 1994, and Ser. No. 142,933, Oct. 29, 1993.

[51] Int. Cl.$^6$ .................................................. G01N 27/90
[52] U.S. Cl. .......................... 324/233; 324/235; 324/241; 324/242
[58] Field of Search .................................. 324/232, 233, 324/234, 235, 238–243

[56] References Cited

U.S. PATENT DOCUMENTS

| | | | |
|---|---|---|---|
| 3,359,495 | 12/1967 | McMaster | 324/235 |
| 3,449,664 | 6/1969 | Smith | 324/235 |
| 4,095,181 | 6/1978 | Harris et al. | 324/238 |
| 4,204,159 | 5/1980 | Sarian et al. | 324/232 |
| 4,379,261 | 4/1983 | Lakin | 324/232 X |
| 4,495,466 | 1/1985 | Lakin | 324/242 |
| 4,595,843 | 6/1986 | DelVecchio et al. | |
| 4,785,243 | 11/1988 | Abramczyk et al. | 324/242 X |
| 4,818,935 | 4/1989 | Takahashi et al. | 324/242 X |
| 5,021,738 | 6/1991 | Vernon et al. | 324/242 X |
| 5,119,023 | 6/1992 | Lloyd | 324/242 X |
| 5,399,968 | 3/1995 | Sheppard et al. | 34/242 |
| 5,404,101 | 4/1995 | Logue | 324/207.17 |

*Primary Examiner*—Gerard R. Strecker

[57] ABSTRACT

A polar coordinates sensor probe, having a plurality of circularly arranged pick-up poles driven by a rotating magnetic field originating in a hollow toroid core, for detecting the reflected rotating eddy current pattern in material (both ferrous and non-ferrous) surrounding fastener holes, wherein the flaw is detected by means of mutual phase-amplitude comparison and adjacent pick-up pole signal phase deviation. The second embodiment having an isolated multi-pole pick-up core, picking up a rotating figure 8 eddy current pattern. Also embodiments utilizing Hall effect and magnetoresistive devices with the rotating magnetic field for flaw detection.

9 Claims, 7 Drawing Sheets

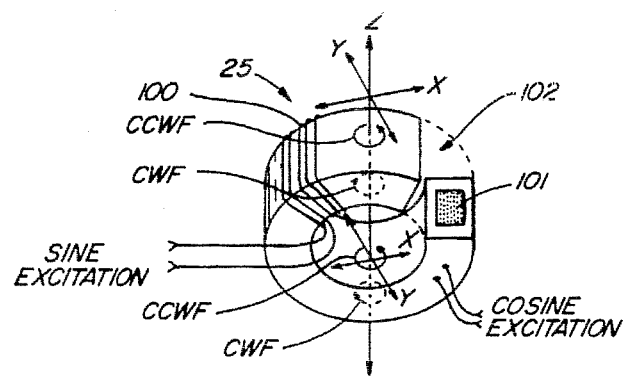
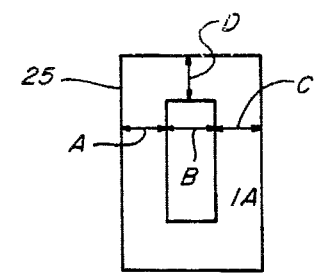
Fig. 1
Fig. 2
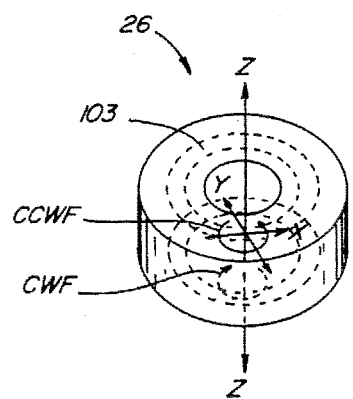
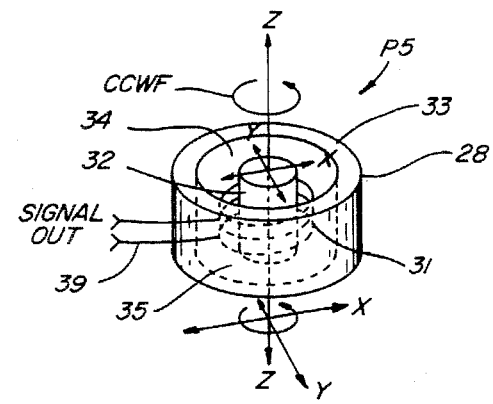
Fig. 3
Fig. 4
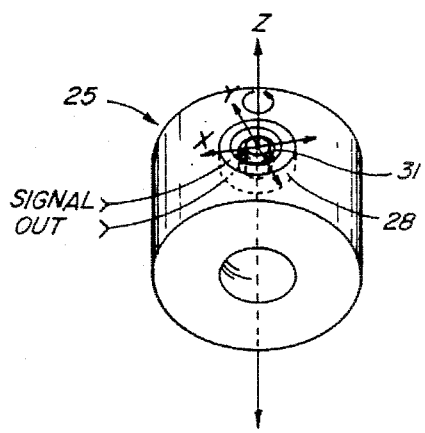
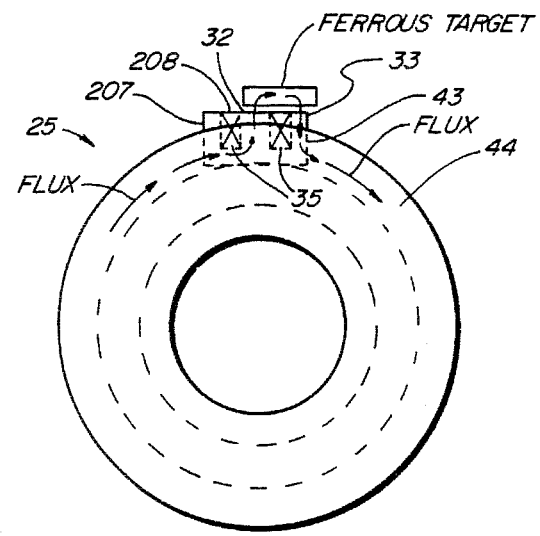
Fig. 5
Fig. 6

POLAR COORDINATES SENSOR PROBE FOR TESTING MATERIAL SURROUNDING FASTENER HOLES

CROSS-REFERENCE TO RELATED PATENT APPLICATIONS

This application is a continuation in part of patent application Ser. No. 07/842,244 entitled "Rotary sensing device" filed Feb. 27, 1992, now U.S. Pat. No. 5,404,101 application Ser. No. 08/108,880 entitled "Rotating Magnetic Field Devices" filed Aug. 18, 1993, now abandoned, pending application Ser. No. 08/142 933 entitled "Apparatus for detecting surface flaws in cylindrical articles by means of asymmetric magnetic detection", filed on Oct. 29, 1993, pending application Ser. No. 08/170,058 filed Dec. 20, 1993, entitled "Cable tester utilizing dual multiple polar sensor assemblies" and application entitled "Polar sensor devices and methods", and pending application Ser. No. 08/187,072 Jan. 27, 1994, all by the same applicant.

BACKGROUND OF THE INVENTION

This invention relates to eddy current instruments for the non-destructive detection of flaws in electrically conductive articles and more particularly to the detection of flaws in the regions of electrically conductive material surrounding fastener holes.

Eddy current instruments of this type utilizing a source or exciting coil for inducing an alternating magnetic field in a material and a pick-up coil for detecting the magnetic field induced are widely used for locating flaws or imperfections in metallic materials. An eddy current instrument of this type detects a flaw by detecting the metal loss due to the flaw. The localized presence of a flaw or crack in the metal upsets the otherwise normal eddy current distribution. This abnormal apportionment of eddy current creates a resultant change in magnetic flux which is sensed by a change in the inductance of the pick-up coil.

Structural wing skins on cargo aircraft are spliced to each other in an overlapping configuration such that the skins are held together by means of fasteners mounted through holes in both skins. Fatigue damage can occur at the fastener hole in either layer of skin. The disclosed apparatus is not intended to be limited to fastener hole flaw detection but also may be utilized to detect surface flaws in any metallic (ferrous or non-ferrous) structure having flat surfaces, in such applications the anomalous flaw signal would be detected by phase-amplitude deviations as in the fastener hole flaw detection application. Controlling of the size and shape (directivity) of the eddy current pattern induced in the inspected material has proved to be a most intricate probe design problem, as addressed in the Sarian U.S. Pat. No. 4,088,953.

Conventional eddy current equipment is available with cup shaped core type probes designed for the detection of large cracks emanating from fastener holes in second or interior layers. Early probe designs interrogate the entire fastener hole during inspection and consequently are not very sensitive to the presence of small cracks. Such absolute measurement systems have an inherent low resolution because the flaw area makes up only a small portion of the total eddy current area under the test probe. Another criterion for reliable flaw detection is a uniform excitation field for inducing a uniform eddy current pattern in the target material, this being pointed out in the Smith et al. U.S. Pat. No. 4,594,549. Sensing the direction of the reflected eddy current pattern has taken several approaches in prior art, usually mechanical rotation, in one approach a mechanically rotatable core portion is rotated in a circular scan around the fastener hole, as in the Harris U.S. Pat. No. 4,095,181. This design and method increased resolution, but a 360 degree mechanical rotation of the probe is required for each hole location. The Lakin U.S. Pat. No. 4,495,466 was an improvement in that the circumference of the hole is broken into several angular segments, by means of a segmented cup-like sensing face structure forming a plurality of pick-up poles. Although the Lakin patent has provided higher resolution without mechanical rotation, nevertheless in the Lakin patent flaw detection depends solely on comparing mutual pick-up voltage levels looking for discrepencies between two voltage levels, and phase difference between individual pole segments is not transduced directly in the cited patent. The Journal of Nondestructive Evaluation, Vol. 2, No. 1, 1981, by B. A. Auld, et al compares three basic eddy current probes: the absolute, the differential and the ferromagnetic resonance (FMR). The microwave frequency FMR probe is disclosed as having a uniform precession mode wherein a magnetic dipole moment is created by the excitation of a sphere of yttrium iron garnet. The above citation states "Time-varying magnetic fields created outside the sphere by this rotating magnetic dipole moment interact with a flaw and produce a flaw detection signal in the same way as the spatially fixed time-alternating equivalent magnetic dipoles representing the coil-type probes" (absolute and differential). This citation is the most pertinent prior art the applicant has found to date.

It is also stated in the above citation that mouth opening flaws were easily observed with the FMR probe but were not detected with the low frequency probes. FMR probes seem to be inherently limited to the ultra high frequencies where the skin effects limit depth penetration.

The Lakin U.S. Pat. No. 4,379,261 discloses segmented (spokes) pot core structures excited by two or three phase current to create a rotating magnetic field which scans the fastener hole. The Lakin patent contends a rotating field essentially eliminated the problems due to lift-off and provided greater sensitivity to detect cracks in the second or bottom layer of material. Although this was a step in the right direction, the rotating magnetic field generated by the Lakin patent is lacking in uniformity due to the rotating field originating in a segmented driving core structure, thus having inherent spatial inhomogeneity, due to the rotating magnetic field being generated in a core structure having a finite number of pole segments. In contrast the rotating magnetic field driving the sensing elements of the present invention is generated in a hollow toroid structure having an infinite number of pole segments e.g. the magnetic domains themselves. The relative significance of this difference is, a small crack in the test specimen may produce a very slight irregularity in the reflected eddy current pattern, and thus may be obscured by a non-uniform driving field. Hall-effect and magnetoresistive chips have been utilized as the detection element in some eddy current fastener hole probes such as the Chapman et al U.S. Pat. No. 3,450,986, and such devices may be utilized with the rotating magnetic field of the present invention to provide an improved Hall-effect or magnetoresistive effect transducer of eddy-current effects.

SUMMARY OF THE INVENTION

This disclosure includes versions of segmented pick-up core polar sensor probes, generating a plurality of phase-amplitude modulated signals, representing flaws in the circumference of fastener holes, such as aircraft fastener holes.

It is an object of the present invention to provide a polar sensor probe (PSP) having the scanning ability of a rotating magnetic dipole moment, yet not restricted to a micro-wave resonant frequency, in contrast the polar sensor may operate at conventional eddy current frequencies (400 HZ–1 MHZ).

A further object of the instant invention is to utilize the hollow toroid core driven polar sensing element (PS), as a 360 degree scanning element having a low reluctance coupling to the work-piece (high directivity), whereby the angular motion of the non-collapsing flux is coupled to the test specimen without mechanical rotation means.

In the preferred embodiments of the present invention, disclosed is a unique polar sensor (polar coordinates) probe having a plurality of circularly arranged driving poles (segments) that induce a plurality of eddy current patterns in the work-piece surrounding the fastener hole. Each eddy current pattern has a fixed phase displacement between adjacent driving poles, and each driving pole also has a pick-up coil wound around it to transduce the individual eddy current impedance under that driving pole (pick-up pole), wherein any anomalous eddy current pattern is detected as a phase and or amplitude deviation, when compared to the signal generated by a mutual pick-up pole, or compared to the hollow toroid driving core sine-cosine excitation signals.

Another object of the invention is to provide a magnetically rotated scan, wherein a flaw is indicated by an anomalous phase deviation between two adjacent pick-up pole signals, representing a structure anomaly. The second embodiment of this polar sensor probe has an isolated concentric multiple pick-up pole structure that is separated from the concentric driving core by a concentric non-ferrous member formed of a high reluctance metal such as silver or copper, providing a circular eddy current image of the specimen. This same polar sensor probe provides both ferrous and non-ferrous specimen inspection, the phase difference between ferrous and non-ferrous metals being 180 degrees, and is a programable parameter of the signal processing means.

It is contemplated Hall-effect chips and magnetoresistive chips may be utilized as the sensing elements in combination with the two disclosed polar sensor probes to provide an alternative eddy current sensing means whereby both pick-up coils and or Hall effect devices may be utilized together to pickup flaw signal components thereby providing the advantages of both types of eddy current transduction.

Alternately it is contemplated magnetoresistive devices may be utilized with the plurality of pick-up coils to provide the advantages of both types of transduction. Hall chips and magnetoresistive chips may be used with both types of polar sensing embodiments of this disclosure.

BRIEF DESCRIPTION OF THE DRAWINGS

FIG. 1 is a perspective view of a hollow toroid core, which is the driving core of the invention.

FIG. 2 is a cross-section of the driving core in FIG. 1.

FIG. 3 is a perspective view of a hollow toroid core showing the relative field rotational directions on a Z-axis through the side walls.

FIG. 4 is a perspective view of a polar sensor element.

FIG. 5 is a perspective view of a mounted polar sensor.

FIG. 6 is a side view of a hollow toroid core with mounted polar sensor showing the flux path connecting a ferrous target.

FIGS. 15A also illustrates the magnetic shield of FIG. 15.

FIGS. 15B, 15C, 15D show the use of Faraday shielding.

ROTATING MAGNETIC FIELD SENSOR FUNDAMENTALS

Figure 7:
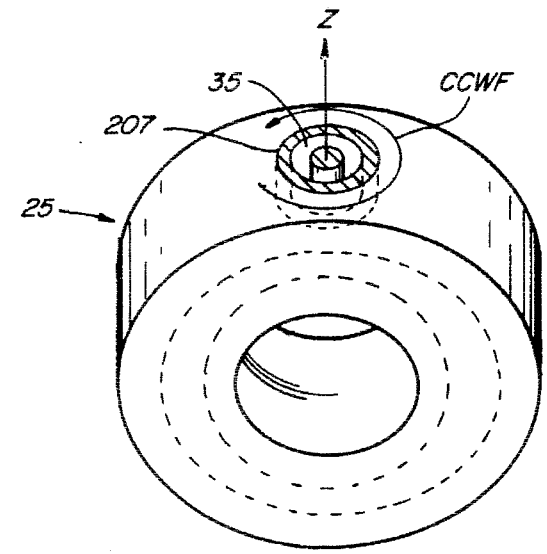
FIG. 7 is a perspective of a hollow toroid core showing the rotating magnetic field coupling a mounted polar sensor.

Referring now to FIG. 1, a hollow toroid core 25 of ferromagnetic material, is shown in a cross-sectional view, a cutaway section 102 showing the inside excitation winding 101, having connecting leads labeled COSINE EXCITATION, and also having an outside excitation winding 100 wound around the outside of hollow toroid 25, having connecting leads labeled SINE EXCITATION. When sine-cosine excitation (two pure sine waves displaced by 90 degrees) are applied to the inside and outside windings (sine excitation being applied to one winding, and cosine excitation being applied to the other winding) a rotating magnetic field is created coextensive throughout the entire core, originating at the domain level. The axis of each rotating magnetic domain being perpendicular to the surface of core 25 everywhere.

Refer now to FIG. 1 to determine the field rotational relationships at four points on a diametrical Z-axis line perpendicularly intersecting the hollow toroid wall at four points. The solid and dashed circular arrows CCWF, and CWF indicate counter-clockwise and clockwise rotational directions.

FIG. 2 is a cross-section view of the hollow toroid showing the relative wall thickness of the hollow toroid core, and dimensions A, C, and D should be equal to provide a uniform flux path for the inside excitation winding.

FIG. 3 is a perspective view of hollow toroid 26 having a hollow space 103; the Z axis intersects the side walls of core 26 and the solid and dashed arrows indicate the relative field rotational directions, (the inside and outside excitation windings are not shown for clarity). In order to utilize this rotating magnetic field for eddy current polar coordinates sensing, one more basic component is added to the hollow toroid, called a polar sensor (PS). FIG. 4 is a perspective view of a polar sensor illustrating the structural detail. The central pole 32 is concentrically surrounded by the concentric outer pole 33, providing an annular coil space 34. Poles 32 and 33 are connected by a base portion 35. The complete pick-up core 28 is formed of ferromagnetic material, and is the same as half a conventional pot core (a hole in the central pole 32 is not needed). The signal coil 31 is wound around the central pole 32 having connecting leads 39. Normally the signal coil leads would enter through a small hole in the base portion.

FIG. 5 is a perspective view of the mounted polar sensor PS, showing how the pick-up core 28 (the polar sensor is made up of a pick-up core and pick-up coil) is mounted in a bore in the outer circumference wall of hollow toroid 25 (the hollow inside excitation winding space is not shown). The Z-axis of pick-up core 28 is perpendicular to the surface of hollow toroid 25. The rotating field is coupled 360 degrees around the pick-up core. Notice the pick-up coil 31 is coplanar to the flux lines of the rotating magnetic field, thus with no target present no flux linking occurs, and no signal is generated. FIG. 6 is a side view of hollow toroid core 25 having a wall 44, and an axial cross-section view of mounted pick-up core 207, and pick-up coil 208. The pick-up core is mounted partially within bore 43. A portion of the rotating flux within core 25 is flowing up through the central pole 32, through the FERROUS TARGET, down through the concentric outer pole 33, and back to core 25, linking pick-up coil 208, generating an output signal. The phase angle of this signal depends on the azimuth location of the target over the outer pole 33. FIG. 7 is a perspective view of the mounted polar sensor, illustrating the 360 degree flux coupling around the pick-up core 207.

DETAILED DESCRIPTION OF THE INVENTION

Figure 8:
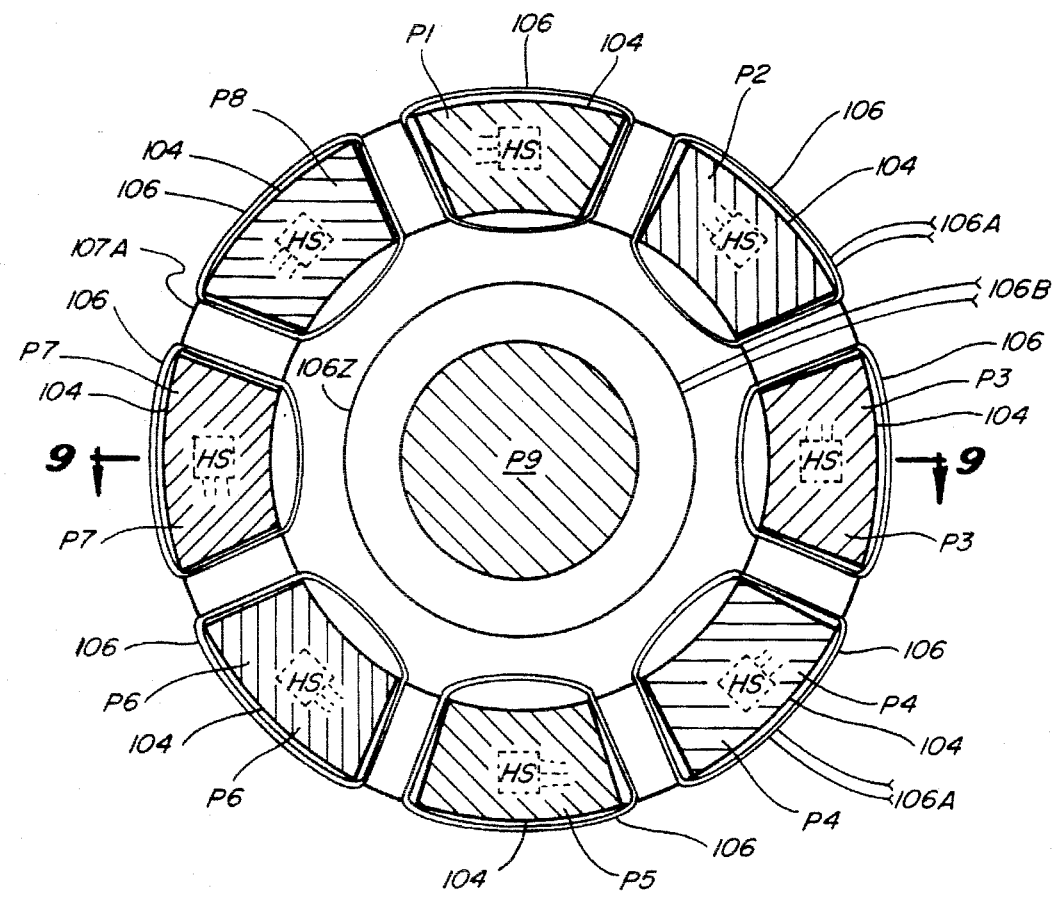
FIG. 8 is a radial view of the first polar sensor probe embodiment.

Described in this section are the preferred embodiments of polar coordinates probes for the detection of flaws in the circumference of fastener holes (both ferrous and non-ferrous workpieces).
First polar sensor probe embodiment FIG. 8 is a radial view of a preferred embodiment of a polar sensor probe designated as PSP-1 being combined with the hollow toroid driving core 100C of FIG. 11.

Figure 9:
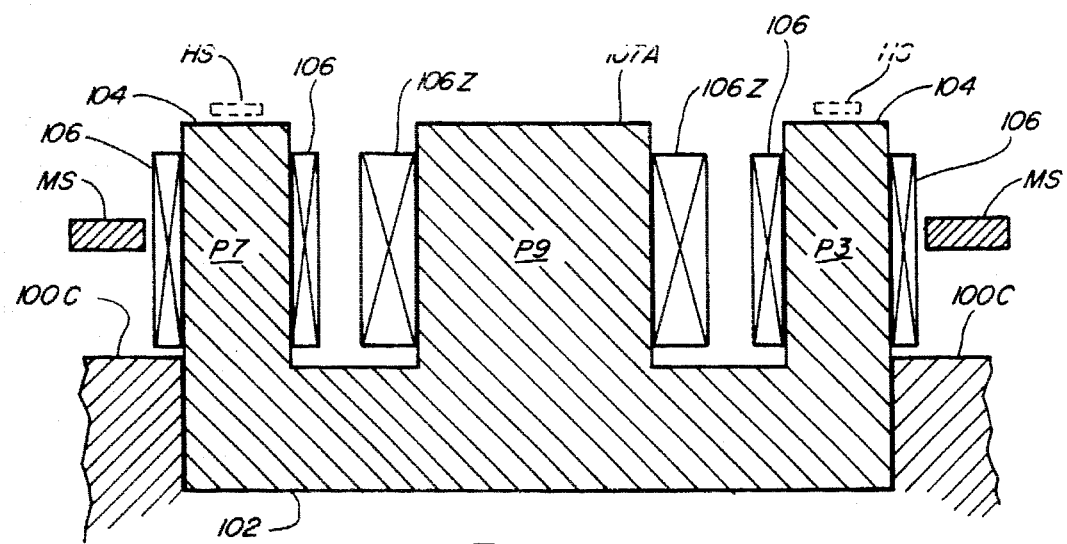
FIG. 9 is a cross-sectional view of the probe in FIG. 8.

Polar sensor probe PSP-1 comprises a ferromagnetic pick-up core 107A, having a high permeability. This cup-like core has eight circumferential segments molded or machined in the outer cylindrical portion forming eight pick-up poles P1–P8, each pick-up pole 104 having a pick-up coil 106 wound around it with coil connecting leads 106A. FIG. 9 is a cross-section view of pick-up core 107A showing two of the segmented outer pick-up poles P7, and P3, also the central pick-up centering pole P9, all eight pick-up poles being molded to a connecting base portion 102 to complete the magnetic circuit. This composite unit is referred to as pick-up core 107A, and is shown in FIG. 9 as being mounted partially within a bore in the outer circumference wall of hollow toroid core 100C (fragmentary view), which fulfills the magnetic coupling requirements of FIG. 6, illustrated in the fundamentals. The axis of the mounted pick-up core 107A is perpendicular to the central axis of the hollow toroid core 100C. The central pick-up pole P9 also has a pick-up coil 106Z wound around it, having connecting leads 106B. The primary purpose of pick-up pole P9 is an integral bolt hole centering means in which this pole being symmetrically surrounded by the eight circumferential pick-up poles P1–P8 is in essence a single-phase polar sensor and as such is 360 degree flux balanced and generates a signal null when the fastener and associated hole are concentrically centered to the axis of the polar sensor probe PSP-1, this providing a convenient integral centering indicator without any additional bridge balancing circuitry.

Figure 10:
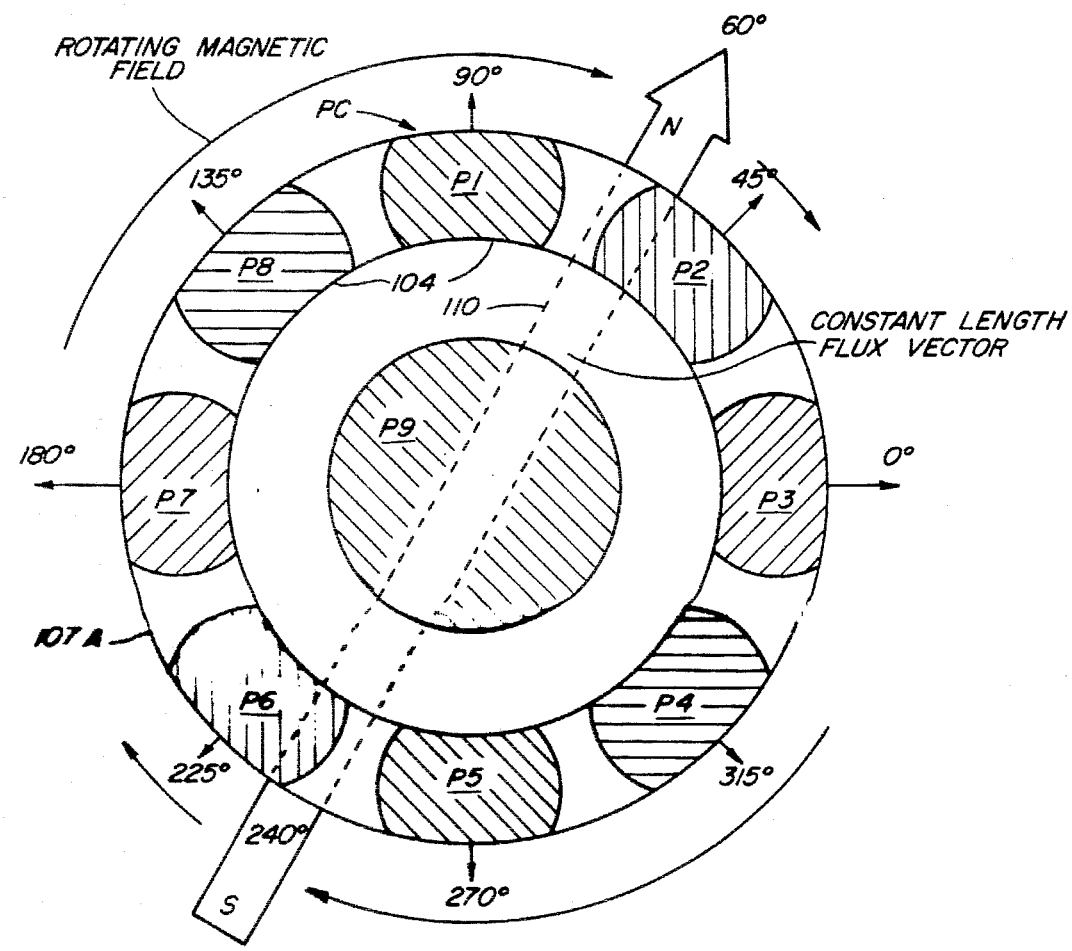
FIG. 10 is a pictorial diagram illustrating the action of the constant length rotating flux vector upon the pick-up core of the first polar sensor probe embodiment.
Figure 11:
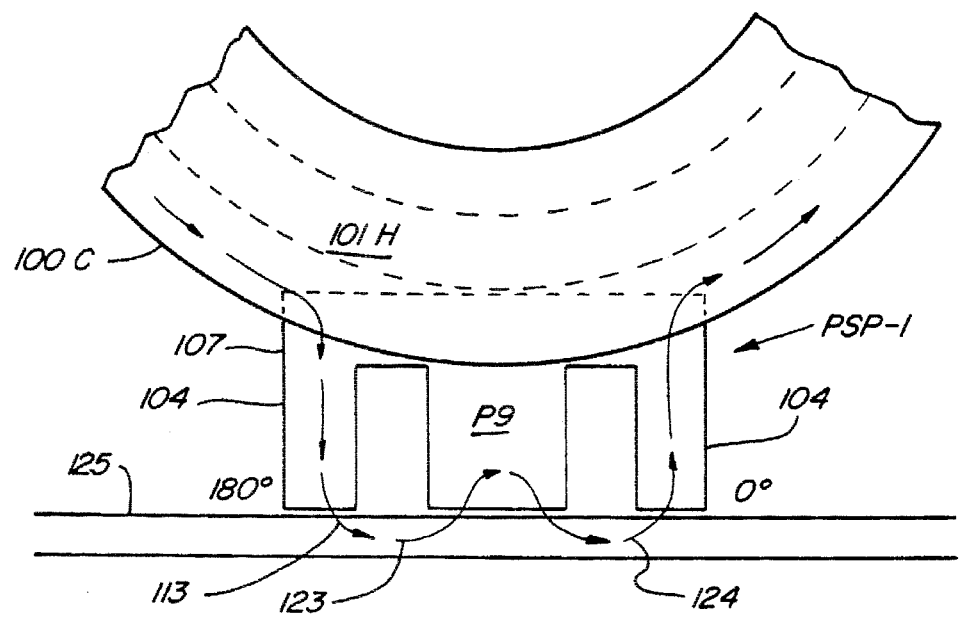
FIG. 11 illustrates the flux distribution path from the polar sensor probe through a workpiece.
Figure 11A:
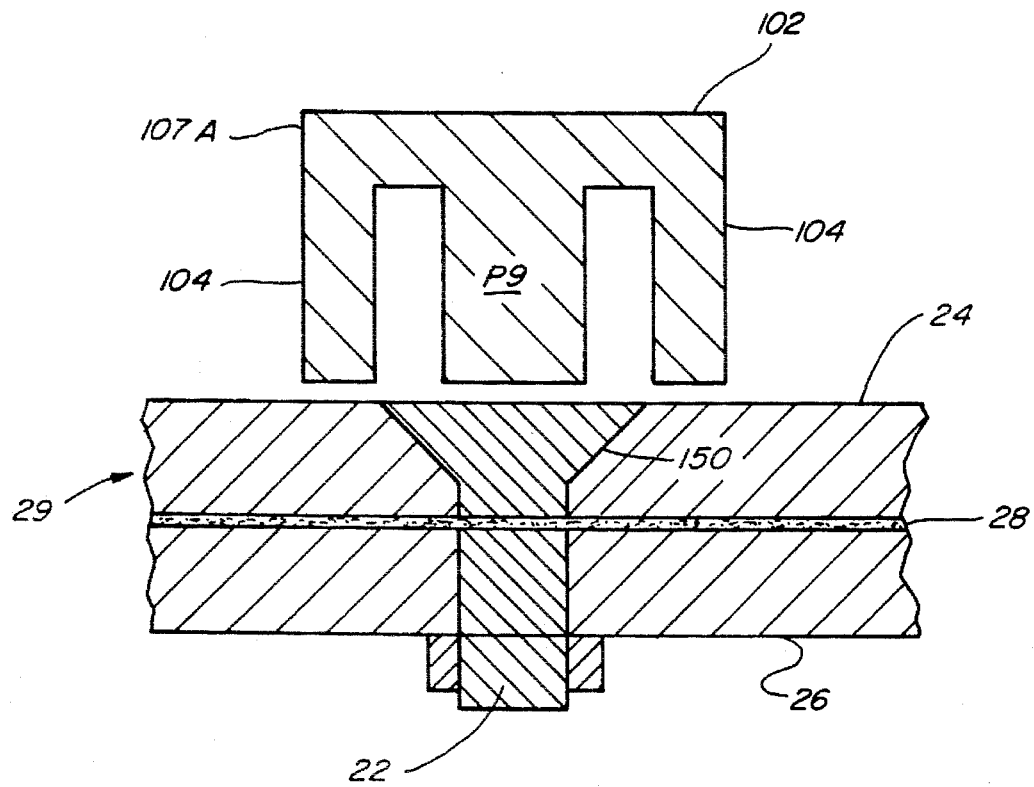
FIG. 11A is a cross-section view of a fastener and hole with the polar sensor probe in position.

The secondary purpose of the central magnetic pole P9 is to provide a return magnetic path for the surrounding pick-up poles P1–P8, this being illustrated in FIG. 11 which is a side fragmentary view of the hollow toroid driving core 100C, (the hollow portion is 101H). Here the magnetic flux lines are conducted from the lefthand portion of hollow toroid 100C to the righthand portion of 100C (the instantaneous angular position of the rotating flux vector in FIG. 11 is shown with the outside excitation winding having the instantaneous entirety of the magnetic domains of core 100C). The flux path 113 shown in FIG. 11 is actually a distributive shunt path, in which some flux lines are flowing through the base portion of the pick-up core 107, some are fringing across the air gaps between the outer pick-up poles 104 and the central pole P9 (a portion of P9 is a shunt flux path) as when no workpiece is present. There is no net flux linkage to pick-up coil 106Z when the rotating flux is symmetrically balanced to the outer poles P1–P8. This balanced flux exists when no workpiece is present or when a fastener is concentric to the sensing face of PSP-1 as in FIG. 11A. This signal null may be utilized as a rivet centering indicator. FIG. 11A also shows the outer layer 24 and the inner layer 26 of specimen 29 having a sealant 28 between layers. The action described above is shown in FIG. 11 wherein the rotating magnetic flux inside the hollow toroid core 100C follows the path 113, shown being coupled to the pick-up core 107 flowing down through the 180 degree azimuth (an arbitrary angular reference) outer pole 104, into the non-ferrous workpiece 125 coupling a portion of the center pole P9 and the inducing eddy currents under the 0 degree azimuth pick-up pole of PSP-1, and back to the hollow toroid core 100C. A similar eddy current action is induced under the 180 degree azimuth pole of PSP-1. Thus two major eddy current depth loops 123, and 124 are induced in the workpiece 125. The point to be made here is, if the two eddy current depth loops remain equal (balanced by a perfect work-piece) throughout the rotating flux cycle, there is no net flux coupling coil 106Z wound around P9. FIG. 10 illustrates the eddy current detection principle employed by both polar sensor probe embodiments PSP-1, and PSP-2.

The eight pick-up poles P1–P8 in FIG. 10 represent the pick-up poles of PSP-1 (a greater or lesser number of pick-up poles may be utilized in these embodiments, depending on the resolution desired) FIGS. 8, 9, 10, 12, and 12A are drawn much enlarged to illustrate detail.

Figure 12:
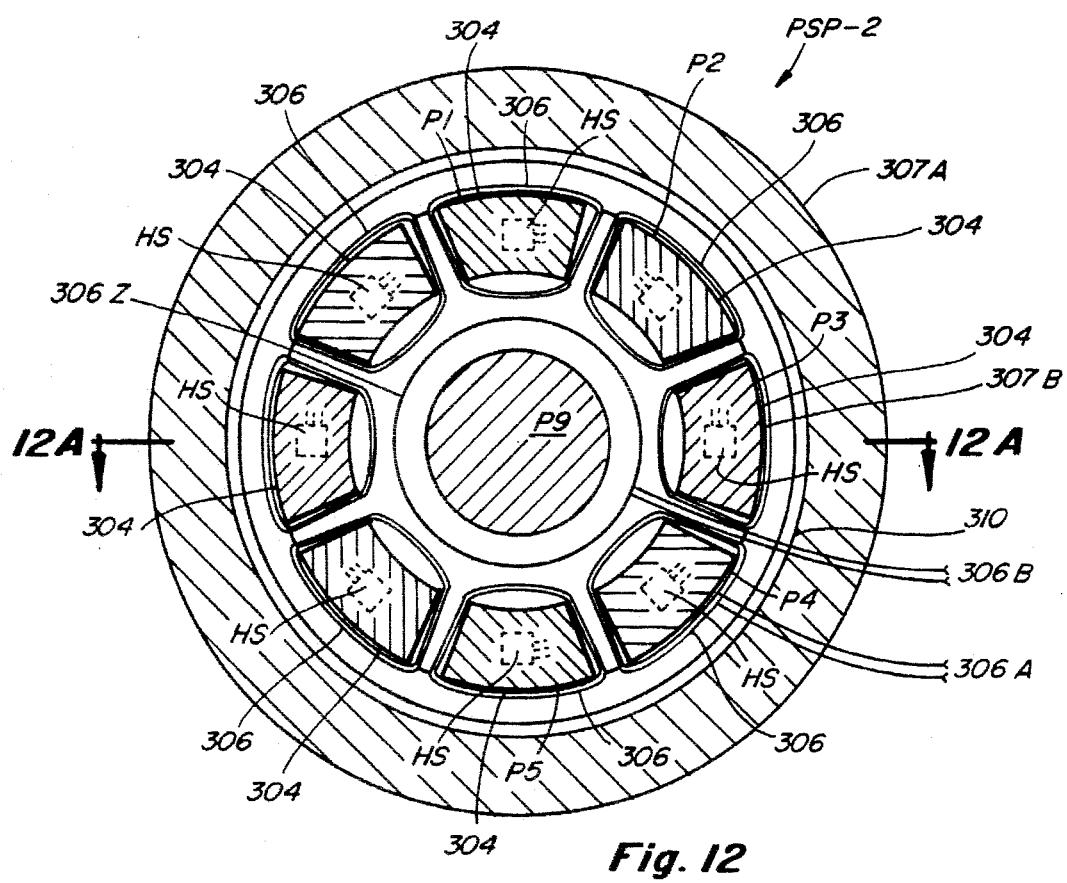
FIG. 12 is a radial view of the second polar sensor probe embodiment.

This eddy current detection principle is based on the action of the constant length rotating flux vector generated in the hollow toroid core 100C as it couples the polar sensor probe pick-up core 107A or 307B of FIGS. 8 and 12, respectively. Each magnetic domain under sine-cosine induction acts as a bar permanent magnet rotating on a mid-point axis. The sum of this action is a constant length flux vector fringing across the face of the polar sening element 107A or 307B. A pick-up core element being mounted in a bore in the wall of the hollow toroid core is coupled 360 degrees around the circumference by this rotating flux, and thus it is driven by the hollow toroid core. In FIG. 10 the constant length rotating flux vector 110 is stopped in time with the north pole polarization pointing toward a 60 degree azimuth heading (circular arrows). If no specimen is present the uniform rotating flux will generate a sinewave flux in each of the eight pick-up poles 104 as vector 110 sweeps by coupling each pick-up pole P1–P8 to the central pick-up pole P9 in turn, thus generating a sinewave signal in each pick-up coil (pick-up coils not shown in FIG. 10. for clarity). Since the pick-up poles 1–8 are equally spaced at 45 degree intervals around the pick-up core circumference, the eight generated signals will also have 45 degree phase displacements i.e. P1 is positioned exactly 45 electrical degrees ahead of P2, and P8 is 45 degrees lagging P1. The exactness of this phase displacement depends solely on the precision of the pick-up core manufacture, and the purity of the sine-cosine excitation. As can be seen the eight pole pick-up core (PC) in FIG. 10 is generating an eight phase signal, like an eight phase alternator (if the poles P1–P8 had windings). If a perfect test specimen (fastener hole and bolt) is concentric to the PC sensing face in FIG. 10, again each of the eight pick-up poles 104 will have this same 45 degree phase displacement relationship as described above, because each pole is seeing identical eddy current reflections, and all will be leading or lagging by the same amount. Since the portion of test specimen under a given pole has a unique electrical impedance depending on cracks and surface irregularities, which are reflected as an eddy current flux leading or lagging, each individual pick-up pole 104 transduces an individual phase displacement signal. The point to be made here is: although the mutual phase angle detected by the eight pick-up poles P1–P8 may change (leading or lagging ferrous or non-ferrous) depending on work-piece presence or absence, the phase displacement between adjacent pick-up poles will be exactly the same. A portion of the work, piece under a given pick-up pole having a flaw such as a crack will be seen by that pole as an anomalous impedance and will generate an anomalous leading or lagging phase angle signal in relation to the adjacent pick-up poles. The phase of the pick-up pole signals in relation to the sine-cosine excitation is also dependent on the work-piece eddy current impedance.

Thus the primary flaw signal component of the present inspection method is an anomalous phase deviation signal generated by one or more of the eight pick-up coils 106 of FIG. 8. This contrasts with the the voltage deviation principle disclosed in the Lakin patent. The additional elements needed to implement this flaw detection probe are a computer and suitable software, to process these eight phase-amplitude modulated signals to extract the flaw components for video display, and reject signals. It is also contemplated a variable frequency sine-cosine excitation source may be used to excite the hollow toroid driving core 100C, this allowing selective eddy current depth penetration. A sweeping frequency sine-cosne generator may also be utilized, in combination with suitable software to provide a wider range of specimen flaw analysis. FIG. 9 also shows a non-ferrous magnetic shield MS being disposed concentrically around the extending portion of the mounted pick-up core 107A, for suppressing the leakage flux from the hollow toroid core 100C; MS may be grounded.

Second polar sensor probe embodiment

Figure 12A:
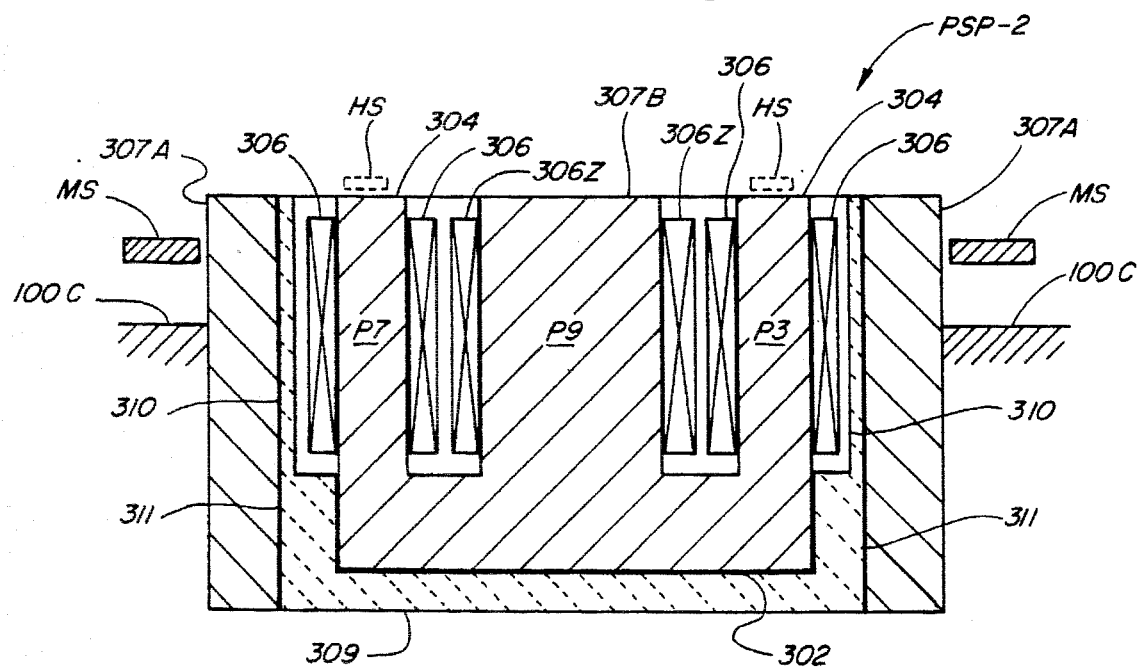
FIG. 12A is a sectional view of PSP-2 in FIG. 12.

FIGS. 12, and 12A show the second embodiment of a polar sensor probe labeled PSP-2 for detecting flaws in the circumference of fastener holes. This second embodiment works on the same principles as the first embodiment PSP-1, except this version has a hollow cylindrical driving core and an isolated multi-pole pick-up core. PSP-2 is a combination of a concentric cylindrical outer driving core 307A, and a isolated segmented cup-like multi-pole pick-up core 307B, both being molded of high permeability ferrite or powdered iron core material. This assembly is mounted in a bore in the outer circumference wall of the hollow toroid driving core 100C, as the first embodiment PSP-1 probe was mounted in FIG. 11. Cylindrical driving core 307A is for coupling the rotating magnetic flux from the hollow toroid 100C in FIG. 11 to the workpiece (not shown in FIGS. 12, 12A). FIGS. 12, and 12A are much enlarged to show detail.

Figure 14:
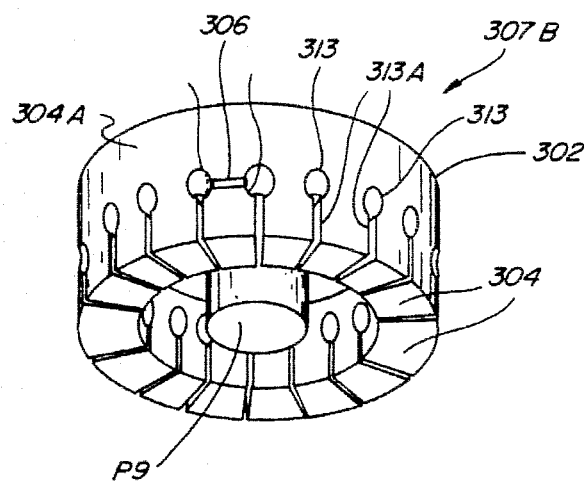
FIG. 14 is the second version of the pick-up core utilized in the second polar sensor probe embodiment.

The outer cylindrical pole 307A is not a pick-up element (having no pick-up coil) and therefore does not have a magnetic base portion, thus none of the rotating flux is shunted by a base portion as in PSP-1, thus more flux is available at the sensing face of PSP-2 to generate eddy currents in the workpiece. A non-ferrous cup-like isolating member 311 formed of a non-ferrous metal such as copper or silver having a base portion 309, is mounted concentric inside the cylindrical outer pole member 307A. The purpose of non-ferrous isolating member 311 is to prevent the rotating flux vector (as shown in FIG. 10) from being shunted directly between cylindrical outer core 307A and the segmented cup-like pick-up core 307B, instead the rotating flux is forced to fringe above the sensing face by the reflected eddy currents in 311. The base portion 309 of member 311 also serves as a Faraday shield for the pick-up coils 306 (eight), and 306Z (one). The high permeability ferromagnetic segmented cup-like multi-coil pick-up core 307B comprises an outer segmented multiple pick-up pole member 304A in FIG. 14, and a central magnetic pole P9 and a connecting base portion 302. Although signal pick-up member 307B is shown having eight pick-up poles P1–P8 in FIG. 12, a greater or lesser number of pick-up poles may be utilized such as sixteen pick-up poles as shown in FIG. 14, which will be described in detail later, the exact number depending on the resolution required by the application.

The thickness of the cylindrical sidewall of non-ferrous member 311 is reduced in the area 310 to provide space for the pick-up coils 306 wound around pick-up poles P1–P8.

Figure 13:
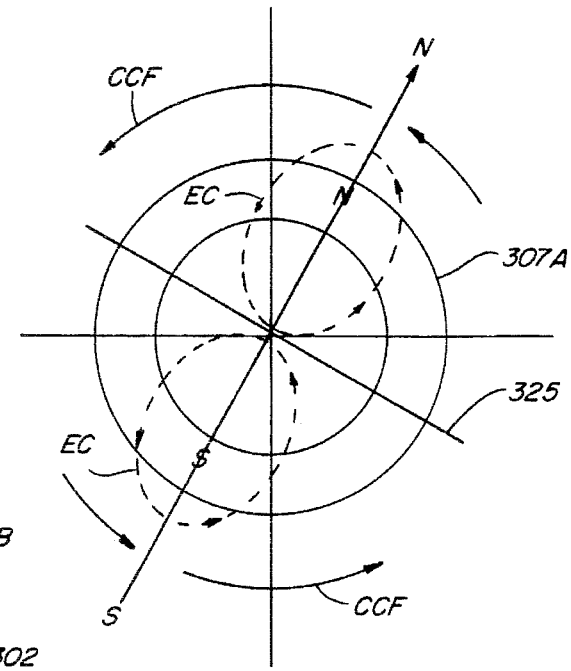
FIG. 13 is a diagram illustrating the figure 8 eddy current pattern generated by the second embodiment of a polar sensor probe.

The prospective operation of this polar sensor probe embodiment is as follows: the unsegmented outer cylindrical pole 307A couples a very uniform rotating magnetic flux to the workpiece (work-piece not shown in FIGS. 12, 12A) inducing a figure 8 eddy current pattern (FIG. 13), and this rotating figure 8 eddy current pattern is picked up by the segmented pick-up core 307B. The non-ferrous member 311 being between the cylindrical outer driving pole 307A and the segmented pick-up core 307B, non-ferrous member 311 acts as an eddy current barrier to direct induction from the concentric cylindrical outer driving pole 307A to the concentric pick-up core 307B, and therefore the greater induction picked up by 307B is the rotating eddy current magnetic field radiated by the workpiece (not shown). The eddy current pattern generated in the workpiece is believed to be a figure 8 pattern extending under the central pole P9, this hypothesis being illustrated in FIG. 13 where a radial view of the sensing face of cylindrical outer driving pole 307A is shown (the figure 8 eddy current pattern is shown in phantom lines EC). Since the sine-cosine excitation of the hollow toroid core induces a constant length rotating flux vector throughout the hollow toroid core, the extending portion of cylindrical outer driving pole member 307A mounted partially within a bore in outer circumference wall of the hollow toroid 100C acts upon the workpiece like a washer shaped permanent magnet (diametrical polarization) spinning on a central axis at the sine-cosine excitation frequency. The effective zero center of this permanent magnet model is shown by the diameter-wise line 325. Constant density (non-collapsing) flux lines fringing across the central opening of 307A induce eddy currents in the workpiece by angular motion (see FIG. 10). The rotation of this constant length flux vector (shown by the curved counterclockwise arrows in FIG. 13) induces a rotating figure 8 pattern of eddy currents into the workpiece, this resulting from the angular motion of the non-collapsing flux vector, which is zero at the exact center of this circular sensing face structure. The last sentence is believed to be the true action. The origin of this homogeneous rotating magnetic field being generated in the hollow toroid core is coupled to the work-piece by means of the unsegmented outer pole member 307A inducing a very uniform eddy current pattern in the work-piece, not possible with conventional rotating magnetic fields produced by means of segmented pole structures such as U.S. Pat. No. 4,379,261. The inherent uniformity of the eddy current pattern produced by the cylindrical driving pole 307A provides a near infinite angular resolution (307A being an unsegmented circular structure), and thus very small anomalous phase deviations may be picked up by the eight pick-up poles P1–P8, of core structure 307B. Since the eight pole segments P1–P8 of the multi-pole pick-up core 307B are above the described rotating eddy current FIG. 8 pattern, this reflected flux induces an eight phase (sixteen phase in the sixteen pick-up pole embodiment) sinewave into poles P1–P8 (the phase displacement between adjacent poles is 45 degrees, for an eight pick-up pole embodiment), this action being also illustrated by FIG. 10.

Figure 12B:
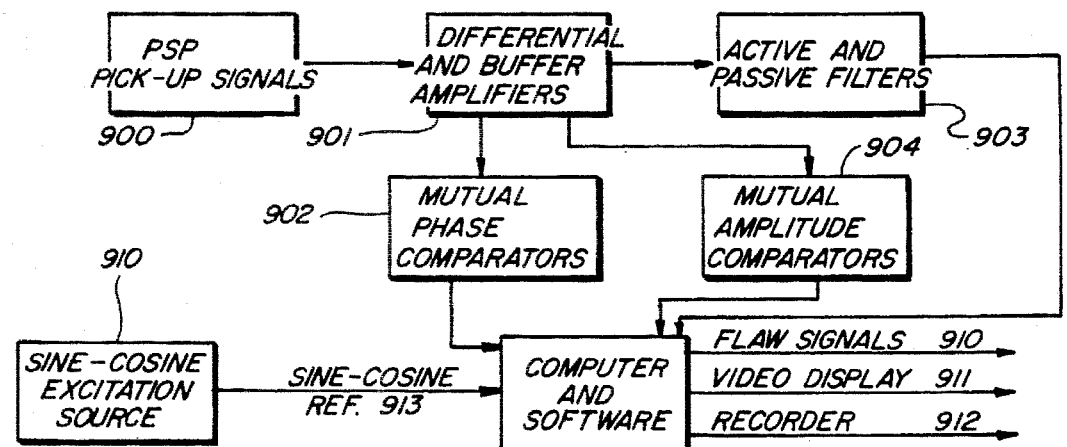
FIG. 12B is a block diagram of an example signal processing circuit that may be used to process the signals generated by the polar sensor probes of this disclosure.

Since the reflected figure 8 eddy current pattern represents the condition of the specimen, and thus the reflected workpiece impedance affects the phase displacement and amplitude between adjacent pick-up pole signals, the signal processing software simply looks for an anomalous phase deviation (leading or lagging) between adjacent poles and amplitude deviations. Since the angular resolution of the polar sensor is less than one degree, very small phase deviations may be accurately detected. Also the phase of the reflected eddy current signals (pick-up poles P1–P8) may be compared to the sine-cosine excitation signals to extract a phase-amplitude deviation representing a specimen flaw. FIG. 12B is a block diagram of an example signal processing circuit for use with the two polar sensor probe embodiments of this disclosure. The phase-amplitude modulated signals picked up by the polar sensing transduction elements (pick-up coils, Hall effect devices, and/or magnetoresistive devices) 900 in FIG. 12B are fed to the differential pre-amplifiers 901, this block may also contain buffer amplifiers. From amplifiers 901 the amplified phase-amplitude modulated signals are fed to the mutual phase comparators 902, this phase comparison also including adjacent pick-up pole phase comparison. From 902 the extracted phase comparison components are fed to the host computer 909. The sine-cosine excitation source is 910 and the sine-cosine reference line is 913.

Also the amplified phase-amplitude modulated signals are fed to the mutual (also means adjacent pick-up pole) amplitude comparators 904, and the resultant signals are fed to the computer 909. The amplified signals from 901 are also fed to the active and passive filters 903 for extracting flaw components and the resultant components are fed to 909. Computer 909 also receives sine-cosine phase reference signals from the sine-cosine source for extracting the reactive components of the reflected eddy current pattern by the host computer 909.

Figure 12C:
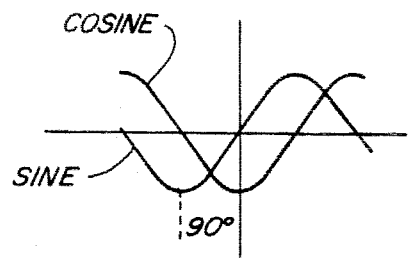
FIG. 12C is a diagram waveforms of the sine-cosine excitation used with the invention.

FIG. 12C shows the two excitation signals that induce the rotating magnetic field in the hollow toroid driving core 100C, illustrating the 90 degree phase displacement. The amplitude of the sine-cosine excitation signals must be adjusted to obtain a circular rotating flux, also depending on the turns impedance of the sine-cosine excitation windings.

The sine-cosine excitation source must generate two pure sine waves displaced by 90 degrees as illustrated in FIG. 12C, a microprocessor generated source is the preferred method, utilizing well known circuits. Central pick-up pole P9 may be utilized as an integral centering device since it is 360 degree flux balanced (signal nulled) by the surrounding pick-up poles P1–P8 (when the polar sensor probe is centered over the fastener bolt head 150 in FIG. 11A a signal null is generated in pick-up coil 306Z).

FIG. 14 is a perspective view of a second embodiment of pick-up core 307B shown in FIG. 12, having sixteen segmented pick-up poles 304, this pick-up pole structure being similar to the pole structure in the Lakin patent, having a plurality of holes 313 with slots 313A through the cylindrical wall. This embodiment provides a better flaw size/pole size ratio for improved resolution since it has twice the number of pick-up poles.

Figure 15:
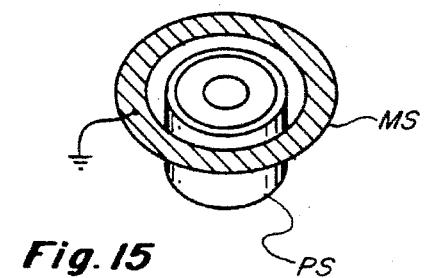
FIG. 15 illustrates the position of a washer-like non-ferrous magnetic shield around the sensing face of a polar sensor element.
Figure 15:
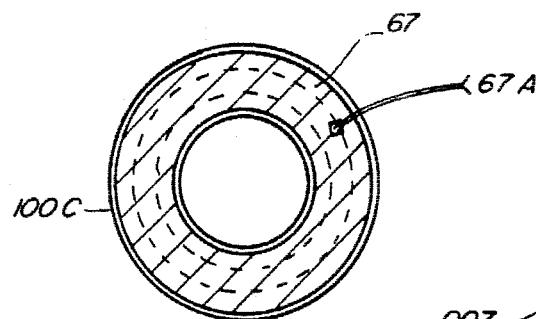
Figure 15:
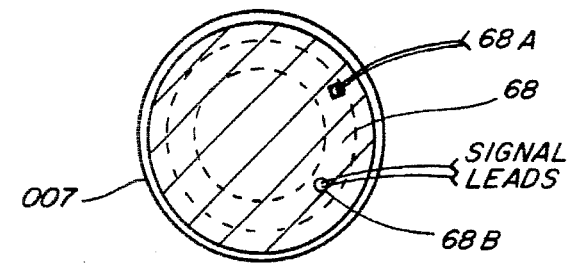
Figure 15:
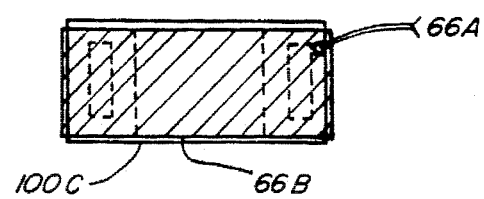
Figure 15:
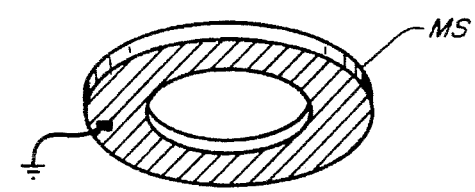

The polar sensor probe embodiments PSP-1, and PSP-2 in FIGS. 8, 12, may require manual or motorized rotation of the probe for complete circumferential coverage of the workpiece. This type of rotation is known in the art, such as the Harrison U.S. Pat. No. 4,445,089 where a stepper motor is utilized for probe rotation. As can be seen only a few degrees (22.5–45) degrees of rotation gives overlapping pick-up coverage. FIG. 12A also shows the position of the non-ferrous magnetic shield MS surrounding the extending portion of the mounted polar sensor probe PSP-2, this washer-like non-ferrous magnetic shield being shown in greater detail in FIG. 15 (pole segments not shown) surrounding a polar sensor element PS (PSP-1 or PSP-2). The high reluctance of the non-ferrous magnetic shield MS blocks the background leakage flux of the hollow toroid core 100C, and has a quasi-focusing on the fringing flux pattern generated by the polar sensing face, thus the uniformity of the eddy current pattern is maintained. Both disclosed polar sensor probe embodiments may be enclosed by a non-ferrous housing in lieu of the magnetic shield MS except for the pick-up pole face to provide complete shielding and protection.

Figure 16:
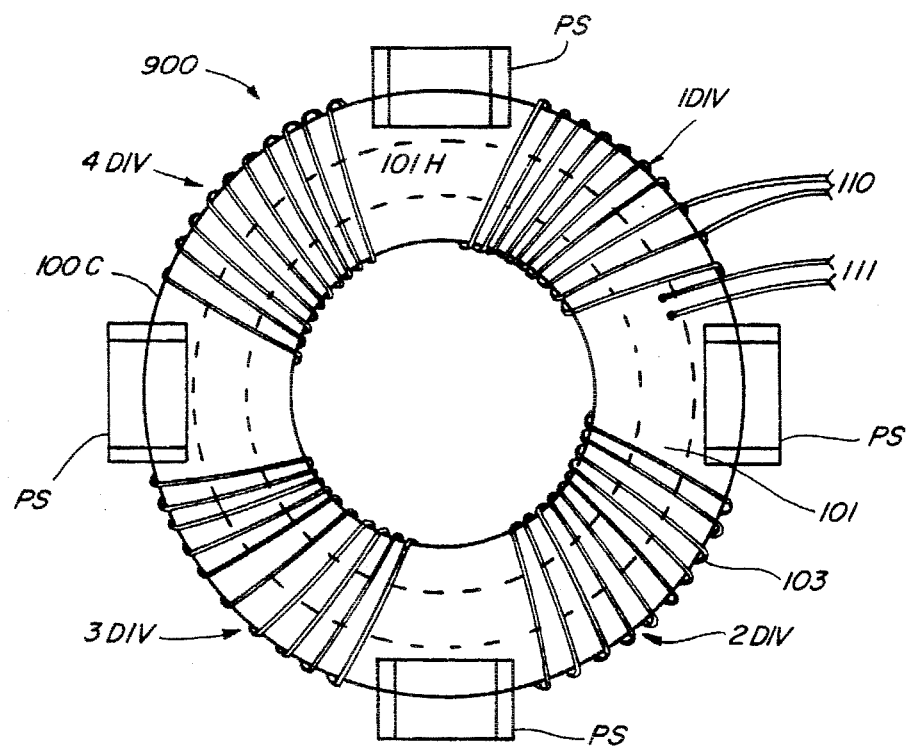
FIG. 16 shows an indexable multi-size polar sensor probe assembly.

FIG. 15A is a perspective view of a magnetic shield MS showing it to be a washer-like shape of non-ferrous metal such as copper or silver having a thickness greater than the induced eddy current depth, this element to be concentrically disposed around the extending portion of the mounted polar sensor pick-up core, and having a grounding lead GND. FIG. 15D is a rear view of a polar sensor pick-up core element (PSP-1 or PSP-2) having a circular Faraday shield attached to the base portion, with a grounding lead 68A. The signal leads are routed out through a small hole 68B in the base portion. FIG. 15B is a radial view of hollow toroid core 100C shown having a Faraday shield 67, having a grounding lead 67A, said shield being attached to the core before winding the outside excitation winding. FIG. 15C is a side view of core 100C having a Faraday shield surrounding a portion (should not be a closed circuit) of the outer circumference, and having grounding lead 66A. In view of the fact fastener rivets and bolts are made in various diameters, therefore flaw detection probes need to be made in corresponding sizes, FIG. 16 shows a method of utilizing the multiple polar sensor provision (the rotating magnetic field being present everywhere in the hollow toroid core) of the hollow toroid core 100C. This provision is utilized to drive a plurality of polar sensors PS mounted in a plurality of bores disposed in the outer circumference wall as shown. The designation PS represents both embodiments of polar sensor probes. It is contemplated at least four different diameter sizes of polar sensing elements (only one size is shown in FIG. 16) may be mounted in the four quadrants of the hollow toroid, in this way only one driving core is needed, and all the necessary sizes of polar sensor probes are ready at hand for different sizes of fastener holes. Also in FIG. 16 the first excitation winding 101 is shown wound within the hollow space 101H having connecting leads 111. Around the outside of the hollow toroid core 100C is wound the second excitation winding 103, being divided in four sub-coils and having connecting leads 110. The outside winding 103 divisions 1DIV, 2DIV, 3DIV, 4DIV must be wound in symmetry to the mounted polar sensors for flux symmetry as ferrites and iron powders have some flux leakage.

This multi-size probe device may be rotably mounted in a handle, with the central axis of the hollow toroid 100C as the indexing axis, to provide indexing different probe sizes to the various fastener sizes.

Hall-effect polar sensor combination embodiments

Disclosed here is a means of detecting the reflected eddy current magnetic field by utilizing Hall-effect chips. Referring again to FIGS. 8, 9, (FIGS. 8, 9 enlarged to show detail) each of the eight pick-up poles P1–P8 may have a Hall-sensor chip (dotted outline HS) attached to the pick-up pole 104 sensing face. In this way the sensing axis of the Hall element is being cut by the hollow toroid flux each revolution of the constant length rotating flux vector, providing a simple auxiliary signal pick-up. The Hall signal may be utilized in combination with the associated pick-up coil 106 signal to provide a greater eddy current image resolution. This Hall-effect signal concept may alternatively be utilized alone i.e. the segment slots may be made more narrow and the pick-up coils 106 deleted.

The size of the Hall chip must be small to allow mounting on the pick-up core face. As a protective measure the Hall chips may be counter-sunk below the polar sensing face surface by molding or machining recesses in the respective pick-up core faces, and in this mounted position the magnetic lines would still enter the sensing axis of the Hall device properly. Since magnetoresistive elements are very similar to Hall effect elements it is contemplated they may be utilized in lieu of the Hall devices, in the same way. Suitable signal processing means must be provided to amplify and extract the flaw components generated by the Hall effect or magnetoresistive devices, these being well known in the art.

As in pick-up coil signal processing, the Hall, or magnetoresistive device signals are processed by mutual phase-amplitude comparison to extract an anomalous phase-amplitude deviation, indicating a crack, or dent in the workpiece. The 180 degree phase difference between ferrous and non-ferrous signals must be programed into the software for proper signal processing.

It will be apparent to those skilled in the art, that many changes, modifications, variations, and other uses and applications of the subject matter disclosed are possible and contemplated. All changes modifications, variations, and other uses and applications which do not depart from the spirit and scope of the invention are deemed to be covered by the invention, which is limited only by the claims which follow.

I claim:

1. A polar sensor probe generating a plurality of phase-amplitude signals in combination with a rotating magnetic field within a hollow toroid driving core for inspecting metal specimens with fastener holes in multi-layer material, said combination comprising:

a) a hollow toroid driving core formed of a high permeability ferromagnetic material, having a bore disposed in the greater circumference wall for mounting a polar sensor probe, the axis of said bore being perpendicular to the central axis of the hollow toroid core, the hollow toroid core being separable into two parts on a plane perpendicular to the central axis for assembly;

b) a polar sensor probe being mounted partially within the bore for 360 degree flux coupling, the portion of the polar sensor being disposed outside the driving core forming an extending portion having a sensing face for coupling a rotating magnetic field to the test specimen;

c) a non-ferrous washer-like magnetic shield concentrically disposed around the extending portion of the polar sensor probe for suppressing the driving core leakage flux;

d) a first excitation winding wound within the hollow toroid core, for inducing a first magnetic field throughout the core;

e) a second excitation winding wound around the outside of the hollow toroid core, being wound in symmetry to the mounted polar sensor probe for flux symmetry, said second excitation winding for inducing a second magnetic field throughout the hollow toroid core;

f) sine-cosine excitation excitation being applied to the first and second excitation windings for inducing a rotating magnetic field throughout the hollow toroid core, said rotating magnetic field having distributive axes perpendicular to the surface of the hollow toroid core everywhere;

g) the sine-cosine excitation frequency being selective for eddy current depth adjustment; the polar sensor probe further comprising:

h) a cup shaped pick-up core formed of a high permeability ferromagnetic material, further comprising: a central magnetic pole coaxially surrounded by a cylindrical outer wall magnetic pole, the central and cylindrical magnetic poles connected at one end by a base portion, the opposite end forming a sensing face, a plurality of equidistant openings through the outer wall, and extending longitudinally from the sensing face a predetermined distance to a plane perpendicular to the cylindrical axis of the pick-up core, to provide a plurality of segmented pick-up poles around the outer wall forming a circle of segmented pick-up poles, the segmented pick-up poles having planes of symmetry through the cylindrical axis which have equal angles, the segmented pick-up poles having sensing face portions, the circle of segmented pick-up poles coupling a rotating flux pattern in the specimen concentric with the fastener hole;

i) a pick-up coil being wound around each of the segmented pick-up poles for generating the said plurality of phase-amplitude modulated signals, the relative phase displacment between adjacent pick-up coil signals being equal and the sum of all the said phase displacements being 360 degrees for an unflawed specimen, an anomalous phase displacement representing a specimen flow.

2. The polar sensor probe according to claim 1, further defined as a fastener hole centering indicator, further comprising:

a) a centering pick-up coil wound around the central magnetic pole for indicating probe centered over fastener hole by a signal null.

3. The polar sensor probe according to claim 1, further defined as a Hall effect flaw detector, further comprising:
   a) a Hall effect device mounted on the sensing face portion of each of the said segmented pick-up poles between the pole face and the workpiece, for generating a plurality of Hall effect signals, the relative phase displacement between adjacent pick-up coil signals being equal, and the sum of all the said phase displacements being 360 degrees for an unflawed specimen, an anomalous phase displacement representing a specimen flaw.

4. The polar sensor probe according to claim 1, further defined as a magnetoresistive flaw detector, further comprising:
   a) a magnetoresistive device mounted on sensing face portion of each of the said segmented pick-up poles, between the pole face and the workpiece, for generating a plurality of magnetoresistive signals, the relative phase displacement between adjacent pick-up coil signals being equal and the sum of all the said phase displacements being 360 degrees for an unflawed specimen, an anomalous phase displacement representing a specimen flaw.

5. The polar sensor probe according to claim 1, further defined as a multi-size indexing probe wherein the said hollow toroid core has a plurality of bores in the outer circumference wall;
   a) the axes of said bores being on lines perpendicular to the central axis of the hollow toroid core;
   b) a plurality of said polar sensor probes of different sizes, being mounted partially within said bores, for inspecting specimen fastener holes of various sizes;
   c) said second excitations winding being wound in symmetry to the mounted polar sensor probes for flux symmetry.

6. An isolated pick-up core polar sensor probe generating a plurality of phase-amplitude modulated signals, in combination with a rotating magnetic field within a hollow toroid driving core, for inspecting metal specimens with fastener holes in multi-layer metal material, said combination comprising:
   a) a hollow toroid driving core formed of a high permeability ferromagnetic material, having a bore disposed in the greater circumference wall for mounting a polar sensor probe, the axis of said bore being perpendicular to the central axis of the hollow toroid core, the hollow toroid core being separable into two parts on a plane perpendicular to the central axis for assembly;
   b) an isolated pick-up core polar sensor probe being mounted partially within the the bore for 360 degree flux coupling, the portion of the pick-up core outside the driving core forming an extending portion having a sensing face for coupling a rotating magnetic field to the workpiece;
   c) a first excitation winding wound within the hollow toroid core, for inducing a first magnetic field throughout the hollow toroid core;
   d) a second excitation winding wound around the outside of the hollow toroid core, being wound in symmetry to the mounted polar sensor probe for flux symmetry, said second excitation winding for inducing a second magnetic field throughout the hollow toroid core;
   e) sine-cosine excitation being applied to the first and second excitation windings for inducing a rotating magnetic field throughout the hollow toroid core, said field having distributive axes perpendicular to the surface of the hollow toroid core everywhere;
   f) the sine-cosine excitation frequency being selective for eddy current depth adjustment.

7. The invention according to claim 6, the said isolated pick-up core polar sensor probe further comprising:
   a) an outer hollow cylindrical driving core formed of a high permeability ferromagnetic material, for coupling the rotating magnetic field in the hollow toroid driving core to the workpiece, being mounted partially within the said bore so as to provide an extending portion outside the hollow toroid core wall for coupling the rotating magnetic field concentric to the specimen fastener hole, for inducing eddy currents therein;
   b) a non-ferrous washer-like magnetic shield disposed concentrically around the said extending portion for suppressing leakage flux from the hollow toroid driving core wall;
   c) a non-ferrous cup-like isolating member, having a cylindrical portion with an inside and outside diameter, and a base portion closing one end, the inside diameter being reduced near the base end for mounting a pick-up core;
   d) said isolating member disposed concentrically within the outer cylindrical driving core with the open end outward toward the workpiece;
   e) a pick-up core formed of a high permeability ferromagnetic material, having a cylindrical outer wall and a central cylindrical pole, with the outer cylindrical wall being joined to the central cylindrical pole at one end by a base portion, the opposite end forming a sensing face, the outer cylindrical wall opposite the base end having a plurality of openings extending through the wall and extending from the sensing face longitudinally to a plane perpendicular to the cylindrical axis of the pick-up core to provide a plurality of pick-up poles in the form of peripheral segments around the outer cylindrical wall, with the pick-up poles having planes of symmetry through the cylindrical axis, which have equal angles between them completely around the cylindrical wall, there being a pick-up coil wound around each pick-up pole, and the rotating flux being coupled to the workpiece by the outer cylindrical driving core induces eddy currents in the workpiece which are picked up indirectly by the pick-up coils generating the said plurality of phase-amplitude modulated signals, the pick-up core being mounted coaxially in the reduced diameter of the non-ferrous isolating member with the base of the pick-up core in contact with the base of the non-ferrous isolating member;
   f) the relative phase displacement between adjacent pick-up coil signals being equal, and the sum of all the phase displacements being 360 degrees for an unflawed specimen, an anomalous phase displacement representing a specimen flaw.

8. The invention according to claim 7, further defined as a fastener hole centering indicator, further comprising:
   a) a centering pick-up coil wound around the central cylindrical pole for indicating probe centering over the fastener hole by a signal null.

9. The invention according to claim 7, further defined as a multi-size indexing probe, wherein the said hollow toroid driving core has a plurality of bores in the outer circumference wall;
   a) the axes of said bores being on lines perpendicular to the central axis of the hollow toroid core;

b) a plurality of said isolated pick-up core polar sensor probes of different sizes being mounted partially within said bore for inspecting specimen fastener holes of various sizes;

c) said second excitation winding being wound in symmetry to the mounted sensor probes for flux symmetry.

* * * * *